United States Patent [19]
Hattori et al.

[11] Patent Number: 5,521,454
[45] Date of Patent: May 28, 1996

[54] SURFACE WAVE FILTER ELEMENT

[75] Inventors: Masumi Hattori, Hirakata; Hideo Torii, Higashiosaka; Masaki Aoki, Minoo; Eiji Fujii, Yawata; Atsushi Tomozawa, Osaka; Ryoichi Takayama, Suita; Ken Kamata, Ikeda; Yasuhiko Horio, Osaka, all of Japan

[73] Assignee: Matsushita Electric Industrial Co., Ltd., Japan

[21] Appl. No.: 302,011

[22] Filed: Sep. 9, 1994

[30] Foreign Application Priority Data

Sep. 16, 1993 [JP] Japan .................................. 5-230203
Sep. 16, 1993 [JP] Japan .................................. 5-230218
Sep. 16, 1993 [JP] Japan .................................. 5-230221
Apr. 28, 1994 [JP] Japan .................................. 6-091750
Apr. 28, 1994 [JP] Japan .................................. 6-091751

[51] Int. Cl.⁶ .................................................. H03H 9/00
[52] U.S. Cl. .................................................. 310/313 R
[58] Field of Search ...................... 333/193; 310/313 A, 310/313 R

[56] References Cited

U.S. PATENT DOCUMENTS 5,401,544  3/1995  Nakahata et al. ................ 310/313 A

FOREIGN PATENT DOCUMENTS 534252   3/1993   European Pat. Off. ......... H03H 9/02
0534354  3/1993   European Pat. Off. ........... 310/313 A
55-77223 6/1980   Japan ............................... H03H 9/25
4358410  12/1992  Japan ............................... 310/313 A
5090871  4/1993   Japan ............................... 310/313 R Primary Examiner—Thomas M. Dougherty
Attorney, Agent, or Firm—Beveridge, DeGrandi, Weilacher & Young

[57] ABSTRACT

A surface wave filter element includes a portion on which elastic surface waves propagate. This portion includes a piezoelectric material, an amorphous boron layer or plate and IDT electrodes for inputting and outputting signals. The piezoelectric material is a film made of ZnO, LiNbO₃ or LiTaO₃ formed by sputtering, ion beam deposition or chemical vapor deposition. The amorphous boron layer or boron plate may be formed on a substrate made of an inorganic material. The boron material is formed using electron beam deposition, ion beam deposition or chemical vapor deposition.

16 Claims, 3 Drawing Sheets

SURFACE WAVE FILTER ELEMENT

BACKGROUND OF THE INVENTION

1. Field of the Invention

The present invention relates to surface wave filter elements used in high frequency circuits of an audio apparatuses, video apparatuses, communication apparatuses or the like.

2. Description of the Related Art

Various surface wave filter elements have been used in circuits of audio apparatuses, video apparatuses, communication apparatuses or the like. A surface wave filter element is basically comprised of a piezoelectric element portion on which elastic surface waves propagate and comb-like IDT electrodes for inputting and outputting signals.

For frequencies in a relatively low range, dielectric ceramics are used for the piezoelectric element portion of the surface wave filter elements. Surface wave filter elements for mobile communication apparatuses using relatively high frequency bands on the order of 1 GHz use single crystal substrate materials such as $LiNDO_3$, $LiTaO_3$ and quartz as the piezoelectric element portion.

Meanwhile in general, when the number of users of a frequency band increases to the limit, the frequency band used is moved into a higher band. For example, when the limit for utilization is reached for a frequency band from 800 MHz, to 900 MHz, which is a frequency band used for portable telephones and cellular telephones, the used band is changed to a 1.4 GHz band, a 1.9 GHz band, and a 2.4 GHz band in the order listed. In this case, a surface wave filter element used in these devices is made adaptable to the higher frequencies.

One factor which determines the center frequency of a surface wave filter element is the line spacing and line width of the comb-like IDT electrodes. Therefore in order to raise the center frequency, it is necessary to make the line spacing tighter and the line width smaller with higher accuracy. But it is difficult to make the tight and narrow line spacing and line width. Then it becomes necessary to make a propagation velocity of elastic surface waves fast, which is a value specific to the material used.

However, the conventionally used ZnO, $LiNbO_3$ or $LiTaO_3$ provides an elastic surface wave propagation velocity on the order of 3 Km/sec. Therefore for example, it is difficult to form the surface wave filter element whose center frequency is approximately 2 GHz or higher by using photolithography utilizing a stepper apparatus. For surface wave filter elements utilizing such piezoelectric materials adapted to frequencies higher than this, an apparatus utilizing X-rays or electron rays as a light source for photolithography is required, which is not easy to fabricate and, therefore, results in a cost increase.

Then as a method for obtaining higher center frequencies, such a surface wave filter element is known which has a film on which elastic surface waves propagate and makes the film by forming a c-axis-oriented ZnO film on a substrate of glass or sapphire perpendicular to the surface thereof.

Further surface wave filter elements fabricated using a material obtained by forming a diamond polycrystalline film on a substrate made of an inorganic material and by forming a ZnO film thereon have been reported (for example, refer to 1989, ULTRASONICS SYMPOSIUM-351).

However one requirement for the structure of a surface wave filter element to be fulfilled to realize the high frequency characteristics is that the surface irregularity of the film thereon should be sufficiently smaller than the wavelength of elastic surface waves propagating thereon. That is the wave length of a signal propagating through the filter element is determined by the propagation velocity of the surface wave and a pitch of the IDT electrodes and therefore the irregularity of surface causes irregularity of the pitch to affect the precision of the wave length. However a diamond film made up of a polycrystalline substance has irregularity (20–30 µ m) on the surface thereof on the order of the crystal grain diameter (20–30 µm) and can not be used for a surface wave filter element as it is. Therefore, it is mirror-finished before use by polishing. However, such a film is difficult to polish because of the following reasons. Although the hardness of the diamond and the boron is similar, namely the diamond is 10 Mose, the boron 9.5 Mose, the amount of abrasion is very different to each other. For example in order to make a rough surface of 10 µm a smooth surface of about 50 nm by using diamond polishing paste, 150 min is necessary in case of the diamond while 5 min is necessary using the crystalline boron material. Therefore the crystalline boron material is very easy to polish as compared to the diamond. Meanwhile the amorphous boron a very smooth surface of 0.1 µm or less .

Meanwhile the boron diamond polishing paste is a best among various polishing materials.

Further the surface smoothness is also required from such view point that the thickness of the ZnO formed on the diamond film is about only 0.1 µm .

As described above, it is not possible to easily obtain a low cost surface wave filter element whose center frequency is approximately 2 GHz or higher using conventional materials.

A surface wave filter element utilizing a diamond film which can have a center frequency higher than 2 GHz is difficult to make smoother on the surface of the film and difficult to fabricate at low cost.

SUMMARY OF THE INVENTION

It is an object of the present invention to provide a surface wave filter element having a portion on the surface thereof on which elastic surface waves can propagate faster than on other portions, wherein the filter element solves the above-described problem.

It is another object of the present invention to provide a surface wave filter element wherein the portion allowing faster propagation of elastic surface waves is made up of a piezoelectric film and a boron layer.

It is another object of the present invention to provide a method for manufacturing a surface wave filter element according to the present invention and to provide a method for manufacturing each portion constituting a surface wave filter element.

The configuration of the present invention will now be described.

The present invention provides a surface wave filter element basically comprised of a portion on which elastic surface waves propagate, comb-like IDT electrodes constituted by an input electrode and an output electrode for signals to and from the surface wave filter element, a boron layer as a part of the portion on which elastic surface waves propagate being in the form of a plate or a film formed on an inorganic substrate material.

The piezoelectric film is made of either ZnO, $LiNbO_3$ or $LiTaO_3$.

The boron film is made of a material having no piezoelectric properties but having semiconductive properties and allows sounds to propagate therein at a velocity as high as approximately 7.5 Km/sec. In combination with the piezoelectric film, it provides elastic surface waves at a high propagation velocity which can not be achieved using only the piezoelectric film.

The combination of the piezoelectric film and the boron layer makes it possible to provide a surface wave filter element which is adaptable to frequencies higher than those available in the prior art. Specifically, in designing the IDT electrodes, the line spacing and line width of the IDT electrodes can be made wider than those available for designs of other IDT electrodes using the conventional piezoelectric material for the same frequency, which is very much advantageous in achieving the desired accuracy. If it is assumed that the IDT electrodes are provided in dimensions similar to those in the prior art, a surface wave filter element adaptable to frequencies twice that available in the prior art or higher can be obtained.

Another feature of the boron layer used in the present invention is that the layer is formed in the amorphous phase. An amorphous layer is very smooth on its surface and is characterized in that it can be used for the fabrication of a filter element without polishing it.

In addition, since the boron film can be easily formed on a substrate made of an inorganic material, a surface wave filter element can be provided at low cost.

Even if the boron layer is polycrystalline, it is softer than diamond and can be easily mirror-finished by polishing.

A surface wave filter element of the present invention comprises
  a piezoelectric film forming a part of a portion on which surface waves propagate,
  a boron layer forming a part of the portion on which surface waves propagate like the piezoelectric film, and
  IDT electrodes for inputting and outputting signals.

In the surface wave filter element according to the invention
  the boron layer is a boron plate or a boron film formed on a substrate made of an inorganic material.

In the surface wave filter element according to the invention
  the boron layer is amorphous or is a polycrystalline element mirror-finished on the surface thereof by polishing.

In the surface wave filter element according to the invention
  the piezoelectric film is made of any one of ZnO, LiNbO$_3$ and LiTaO$_3$.

A method for manufacturing a surface wave filter element of the present invention comprises the steps of:
  making input/output IDT electrodes on a surface of a boron plate, and
  forming a piezoelectric film using any one of sputtering, vacuum deposition, ion beam deposition and a CVD method.

A method for manufacturing a surface wave filter element of the present invention comprises the steps of:
  forming a boron layer using any one of electron beam deposition, ion beam deposition and a CVD method on an inorganic substrate,
  making input/output IDT electrodes, and
  forming a piezoelectric film using any one of sputtering, vacuum deposition, ion beam deposition and a CVD method.

In the method of manufacturing a surface wave filter element according to the invention
  the piezoelectric film is a ZnO film formed using an organic Zn compound as the material and oxygen as the reactant gas and using atmospheric pressure CVD, low pressure CVD or plasma-excited CVD method.

In the method of manufacturing a surface wave filter element according to the invention
  the piezoelectric film is a ZnO film formed using a β-diketone type Zn complex as the material and oxygen as the reactant gas and using atmospheric pressure CVD, low pressure CVD or plasma-excited CVD method.

In the method of manufacturing a surface wave filter element according to the invention
  the organic Zn compound is dimethyl Zn or diethyl Zn.

In the method of manufacturing a surface wave filter element according to the invention
  the β-diketone type Zn complex is Zn-pivaloylmethane or Zn-acetylacetonate.

In the method of manufacturing a surface wave filter element according to the invention
  the piezoelectric film is a LiNbO$_3$ film formed using Li-dipivaloylmethane and Nb-ethoxide which are organometallic compounds as the material and oxygen as the reactant gas and using any one of atmospheric pressure CVD, low pressure CVD and plasma-excited CVD method.

In the method of manufacturing a surface wave filter element according to the invention
  the piezoelectric film is a LiTaO$_3$ film formed using Li-dipivaloylmethane and Ta-pentaethoxide or Ta-pentamethoxide which are organometallic compounds as the material and oxygen as the reactant gas and using any one of atmospheric pressure CVD, low pressure CVD and a plasma-excited CVD method.

In the method of manufacturing a surface wave filter element according to the invention
  the boron layer formed on the surface of the substrate made of an inorganic material is a boron film formed using trialkylboron as the material and using either low pressure CVD or plasma-excited CVD method in a hydrogen atmosphere.

In the method of manufacturing a surface wave filter element according to the invention
  the boron layer formed on the surface of the substrate made of an inorganic material is a boron film formed using either BCl$_3$ or BBr$_3$, which is a halide of boron, as the material in a hydrogen atmosphere.

Table 1 represents data about various surface wave filter elements with regard to film thickness, producing method, and so on.

DETAILED DESCRIPTION OF THE PREFERRED EMBODIMENTS

The present invention will now be more specifically described in specific embodiments thereof with reference to the accompanying drawings.

A first embodiment of the present invention will now be described.

Figure 1:
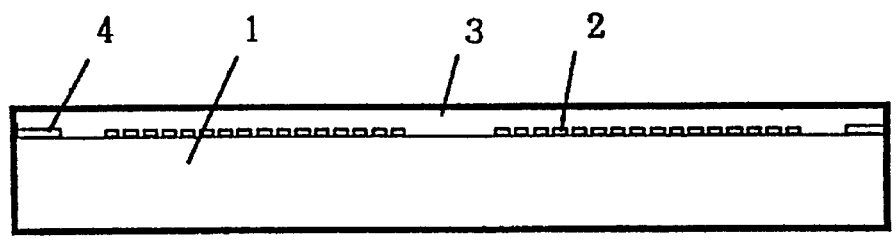
FIG. 1 is a sectional view of a surface wave filter element according to an embodiment of the present invention.

FIG. 1 is a sectional view of an embodiment of a surface wave filter element according to the present invention.

Figure 2:
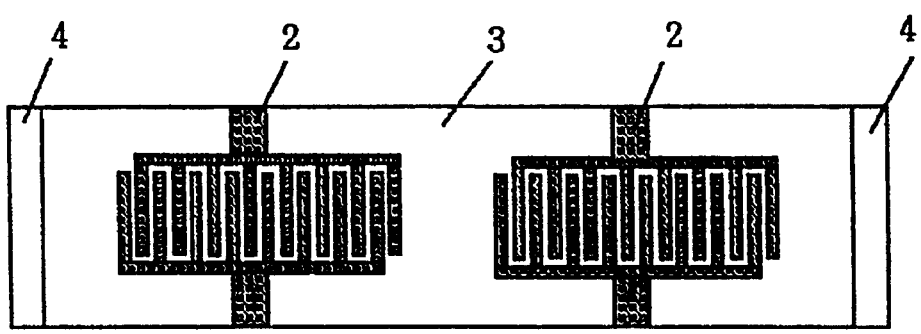
FIG. 2 is a plan view of the surface wave filter element according to the embodiment shown in FIG. 1.

FIG. 2 is a plan view of the same.

1 designates a boron substrate which is in the amorphous phase or is a polycrystalline substance polished on the surface thereof.

2 designates IDT electrodes for inputting and outputting signals which are formed like a comb using photolithography after forming a metal film on the boron substrate.

3 designates a piezoelectric film which is a polycrystalline ZnO film c-axis-oriented perpendicular to the surface.

4 designates metal films for preventing reflection which prevent elastic surface waves from being reflected at both ends of the surface wave filter element.

The surface wave filter element is constituted by a portion on which elastic surface waves propagate made up of the boron substrate 1 and the ZnO film 3 formed on the boron substrate 1, the comb-like IDT electrodes 2, and the films 4 for preventing elastic surface waves from being reflected at both ends of the element.

Figure 5:
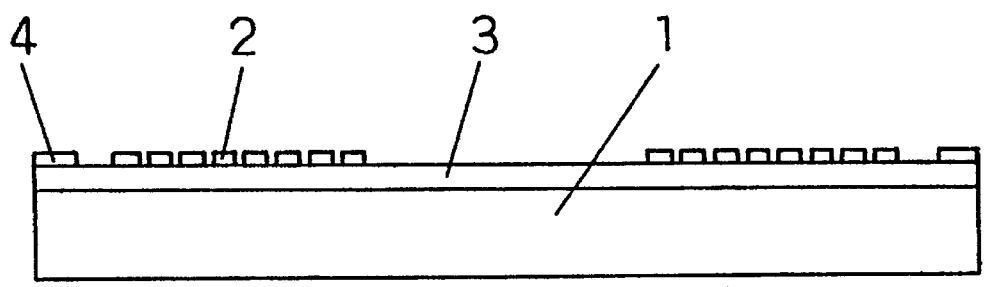
FIG. 5 is a sectional view of a surface wave filter element according to another embodiment of the present invention.
Figure 6:
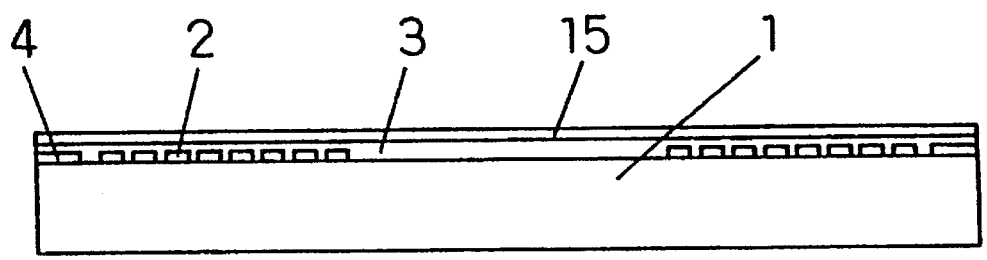
FIG. 6 is a sectional view of a surface wave filter element according to another embodiment of the present invention.

Although the surface wave filter element of the embodiment shown in FIG. 1 has a configuration wherein the IDT electrodes 2 are sandwiched between the boron substrate 1 and the ZnO film 3, the characteristics of the element is available with a configuration wherein the IDT electrodes 2 are provided on the znO film 3 as shown in FIG. 5 or a configuration wherein a counter electrode 15 made up of a metal film is further formed on the ZnO film 3 as shown in FIG. 6.

Methods for manufacturing the surface wave filter element according to the embodiment shown in FIG. 1 will now be described.

Aluminum films were formed on boron substrates 1 in the amorphous phase having a thickness of 0.5 mm using vacuum deposition. Aluminum comb-like IDT electrodes 2 having an electrode pitch of 1.5 μm were provided using photolithography. At the same time the metal films for preventing reflection 4 are formed at the both sides, ZnO films 3 having a thickness of approximately 60 nm were formed thereon according to the methods as described below.

(1) A ZnO film 3 was formed by sputtering using sintered ZnO as the target. Alternatively, a ZnO film 3 was formed using metal Zn as the target ant oxygen as the reactant gas.

(2) ZnO films 3 were formed using electron beam deposition and ion beam deposition. The ZnO films 3 formed using such methods exhibited substantially the same characteristics as those of the ZnO film 3 formed using sputtering.

In any of the methods described in the above methods (1) and (2), the films 3 were formed under conditions such that preferable films having c-axis orientation perpendicular to the surfaces thereof could be obtained.

(3) According to the plasma-excited CVD method, Zn acetylacetonate which is a β-diketone type Zn complex was heated and vaporized at 120° C.; it was transported onto a boron substrate 1 heated to 300° C. placed in plasma using inert gas as the carrier gas; and a ZnO film 3 was formed on the surface of the substrate using oxygen as the reactant gas.

ZnO films 3 formed on boron substrates 1 using atmospheric pressure CVD and low pressure CVD exhibited substantially the same characteristics as those of the film formed using plasma-excited CVD.

It was confirmed that the heating temperature for a substrate at which film formation can take place can be lower for low pressure CVD than for atmospheric pressure CVD and can be lower for plasma-excited CVD than for low pressure CVD.

ZnO films 3 were formed on heated boron substrates 1 according to low pressure CVD and plasma-excited CVD using, as the material, heated and vaporized Zn-pivaloylmethane, which is a complex of the same type or dimethyl Zn or diethyl Zn, which is an organic Zn compound and using oxygen as the reactant gas. The ZnO film 3 formed according to such methods exhibited substantially the same characteristics as those of the films formed of other materials.

In the above methods (1), (2) and (3) the bandpass characteristics of surface wave filter elements fabricated in such ways included an out-of-band suppression rate of −30 dB at the center frequency of 4 GHz thereof.

A second embodiment of the present invention will now be described.

Figure 3:
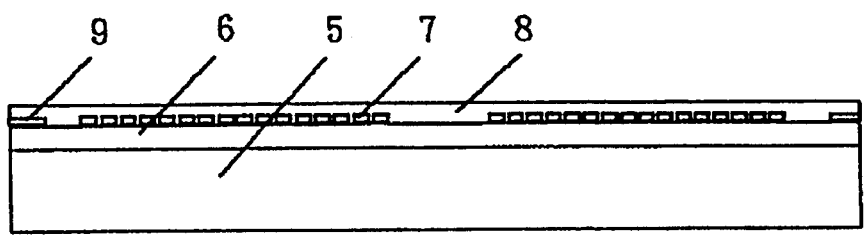
FIG. 3 is a sectional view of a surface wave filter element according to another embodiment of the present invention.

FIG. 3 shows an embodiment of another configuration of a surface wave filter element according to the present invention.

5 designates a substrate made of an inorganic material mirror-finished on the surface thereof by polishing.

6 designates a boron film having a thickness of approximately 5 μm formed on the substrate 5.

7 designates IDT electrodes for inputting and outputting signals which were formed like a comb in the same manner as the electrodes 2 in FIG. 1 according to the first embodiment.

8 designates a polycrystalline ZnO film which was formed in the same manner as in the first embodiment.

9 designates reflection preventing films for preventing elastic surface waves from being reflected at both ends of the surface wave filter element which were formed in the same manner as in the first embodiment.

Methods for manufacturing the surface wave filter element according to the embodiment shown in FIG. 3 will now be described.

Boron films in the amorphous phase having a thickness of 5 μm were formed according to the methods described below on substrates made of an inorganic material mirror-finished on the surfaces thereof by polishing. The inorganic material is glass, ceramics and so on.

(1) A boron film 6 was formed using bulk-shaped boron as the material on a substrate 5 made of an inorganic material which had been heated according to the electron beam deposition method. The amorphous boron film 6 was formed by adjusting the temperature to which the substrate 5 made of an inorganic material was heated. At heating temperatures which are too high, e.g., 600° C., a polycrystalline boron film 6 can be formed. Such a boron film 6 can be used as a surface wave filter element according to the present invention by mirror-finishing the surface thereof by polishing.

(2) Boron films 6 having the same characteristics could be obtained using methods other than electron beam deposition, i.e. ion beam deposition and sputtering. When sputtering is used, the formation of the film is preferably performed in a reducing atmosphere.

(3) The boron film 6 can be formed using CVD.

A gas obtained by heating and vaporizing triethylboron is used as the material. The gas was introduced in plasma using inert gas as the carrier gas. Then, a boron film 6 was formed on a substrate 5 made of an inorganic material which had been heated to 450° C. using hydrogen as the reactant gas. The boron film 6 thus formed was in the amorphous phase. When the heating temperature for the substrate 5 made of an inorganic material was increased to 650° C., a polycrystalline boron film 6 was obtained. The resistance of the boron film 6 thus formed was $10^7 \Omega/cm$.

Using a gas obtained by heating and vaporizing trimethylboron as the material, the formation of a boron film 6 on a substrate made of an inorganic material in plasma could be performed under the same conditions as in the case of triethylboron.

Using a gas obtained by heating and vaporizing trialkylboron as the material, a boron film 6 could be formed under the same conditions as in the case of triethylboron.

The above described boron films 6 were formed according to plasma-excited CVD. Boron films 6 having equivalent characteristics were obtained using atmospheric pressure CVD and low pressure CVD by adjusting the temperature to which the substrate 5 made of an inorganic material is heated.

(4) low pressure CVD using a gas obtained by heating and vaporizing BCl3 or $BBr_3$ (which is a halide of boron) as the material and hydrogen as the reducing gas resulted in the formation of a boron film 6 in the amorphous phase on a substrate at a temperature in the range between 600° C. and 800° C.

In the above methods (1), (2), (3) and (4) the IDT electrodes 7, ZnO film 8, and reflection preventing films 9 were formed in the same manners as in the first embodiment.

If the temperature at which the ZnO film 8 is formed is too high, aluminum can not be used for the IDT electrodes 7 which, in this case, must be fabricated using, for example, an Au film which has good oxidation resisting properties.

In the above methods (1), (2), (3) and (4), the bandpass characteristics of the surface wave filter elements fabricated in such ways included an out-of-band suppression rate of −28 dB at the center frequency of 4 GHz thereof.

A third embodiment of the present invention will now be described.

Figure 4:
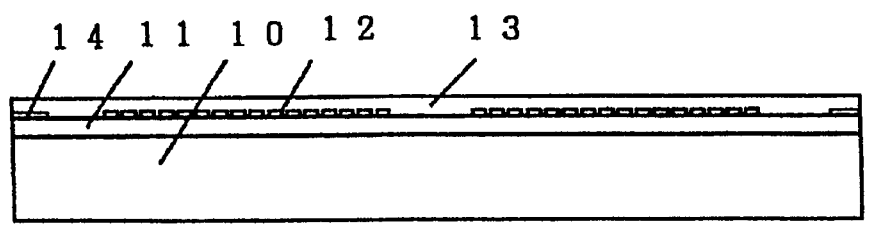
FIG. 4 is a sectional view of a surface wave filter element according to another embodiment of the present invention.

FIG. 4 shows an embodiment of another configuration of a surface wave filter element according to the present invention.

10 designates a substrate made of an inorganic material mirror-finished on the surface thereof by polishing.

11 designates a boron film formed on the substrate 10.

12 designates IDT electrodes which were comb-like electrodes formed in the same manner as in the first embodiment. The metal material constituting the IDT electrodes was Au films.

13. designates a piezoelectric film formed of $LiNbO_3$ or $LiTaO_3$.

14 designates reflection preventing films similar to those in the first embodiment.

Methods for manufacturing the surface wave filter element according to the embodiment shown in FIG. 4 will now be described.

The substrate 10 made of an inorganic material, boron film 11, IDT electrodes 12, and reflection preventing films are the same as those in the second embodiment.

$LiNDO_3$ and $LiTaO_3$ films 13 (which were piezoelectric films) were formed according to the following methods.

(1) As the material for the $LiNbO_3$ film 13, a gas obtained by mixing heated and vaporized Li-dipivaloylmethane and Nb-ethoxide was used. The $LiNbO_3$ film 13 was formed by putting the material in contact with a heated substrate 10 made of an inorganic material in plasma using oxygen as the reactant gas and inert gas as the carrier gas. The substrate 10 made of an inorganic material was heated to a temperature in the range between 450° C. and 650° C. The thickness of the $LiNbO_3$ film 13 formed was 60 nm.

(2) As the material for the $LiTaO_3$ film 13, a gas obtained by mixing heated and vaporized Li-dipivaloylmethane and Ta-pentamethoxide was used. The $LiTaO_3$ film 13 was formed by putting the material in contact with a heated substrate 10 made of an inorganic material in plasma using oxygen as the reactant gas and inert gas as the carrier gas. The substrate 10 made of an inorganic material was heated to a temperature in the range between 450° C. and 550° C. The thickness of the $LiTaO_3$ film 13 formed was 60 nm.

(3) A $LiNbO_3$ or $LiTaO_3$ film 13 having a thickness of 60 nm was formed by sputtering. Sintered $LiNDO_3$ or $LiTaO_3$ was used as the target material in this case, and the substrate 10 made of an inorganic material was heated to 550° C.

The bandpass characteristics of surface wave filter elements utilizing a film 3 made of $LiNbO_3$ or $LiTaO_3$ fabricated in such ways included an out-of-band suppression rate of approximately −28 dB at the center frequency of 4 GHz thereof.

Table 1 shows the data of various structures of the embodiments of the present invention with regard to the thickness of the piezoelectric film, producing method of the film, propagation velocity of the surface wave, IDT electrode pitch, center frequency of the filter element, and out-of-band suppression rate.

As apparent from Table 1, the embodiments have various superior effects.

While the present invention has been shown and described with reference to the foregoing preferred embodiments, it will be apparent to those skilled in the art that other changes in form and detail may be made therein without departing from the scope of the invention as defined in the appended claims.

What is claimed is:

1. A surface wave filter element, comprising:

a piezoelectric film forming a part of a portion on which surface waves propagate, an amorphous boron layer or plate forming a part of said portion on which surface waves propagate, and IDT electrodes for inputting and outputting signals.

2. The surface wave filter element according to claim 1, wherein said boron layer or plate is provided on a substrate made of an inorganic material.

3. The surface wave filter element according to claim 1 or claim 2, wherein said piezoelectric film is made of a material selected from the group consisting of ZnO, $LiNbO_3$ and $LiTaO_3$.

4. A surface wave filter element, comprising:

an amorphous boron layer or plate forming a part of a portion of the wave filter element on which surface waves propagate, a piezoelectric material formed on the boron layer or plate, wherein the piezoelectric material forms a part of the portion of the wave filter element on which surface waves propagate, and IDT electrodes for inputting and outputting signals formed on the piezoelectric element.

5. The surface wave filter element according to claim 4, wherein the boron layer or plate is provided on a substrate made of an inorganic material.

6. The surface wave filter element according to claim 5, wherein the boron layer or plate is provided in the form of a boron film on the substrate.

7. The surface wave filter element according to claim 6, wherein the piezoelectric material is made of a material selected from the group consisting of ZnO, LiNbO$_3$ and LiTaO$_3$.

8. The surface wave filter element according to claim 5, wherein the piezoelectric material is made of a material selected from the group consisting of ZnO, LiNbO$_3$ and LiTaO$_3$.

9. The surface wave filter element according to claim 4, wherein the piezoelectric material is made of a material selected from the group consisting of ZnO, LiNbO$_3$ and LiTaO$_3$.

10. A surface wave filter element, comprising:

an amorphous boron layer or plate forming a part of a portion of the wave filter element on which surface waves propagate, a piezoelectric material formed on the boron layer or plate, wherein the piezoelectric material forms a part of the portion of the wave filter element on which surface waves propagate, and IDT electrodes for inputting and outputting signals formed on the amorphous boron layer or plate.

11. The surface wave filter element according to claim 10, wherein the boron layer or plate is provided on a substrate made of an inorganic material.

12. The surface wave filter element according to claim 11, wherein the boron layer or plate is provided in the form of a boron film on the substrate.

13. The surface wave filter element according to claim 12, wherein the piezoelectric material is made of a material selected from the group consisting of ZnO, LiNbO$_3$ and LiTaO$_3$.

14. The surface wave filter element according to claim 11, wherein the piezoelectric material is made of a material selected from the group consisting of ZnO, LiNbO$_3$ and LiTaO$_3$.

15. The surface wave filter element according to claim 10, wherein the piezoelectric material is made of a material selected from the group consisting of ZnO, LiNbO$_3$ and LiTaO$_3$.

16. The surface wave filter element according to claim 10, wherein a counter electrode is provided on the piezoelectric material.

* * * * *